(12) United States Patent
Lim et al.

(10) Patent No.: US 6,228,727 B1
(45) Date of Patent: May 8, 2001

(54) METHOD TO FORM SHALLOW TRENCH ISOLATIONS WITH ROUNDED CORNERS AND REDUCED TRENCH OXIDE RECESS

(75) Inventors: Chong Wee Lim, Tmn. Century (MY); Soh Yun Siah, Singapore (SG); Eng Hua Lim, Singapore (SG); Kong-Hean Lee, Singapore (SG); Chun Hui Low, Johor (MY)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/405,061

(22) Filed: Sep. 27, 1999

(51) Int. Cl.[7] .................................................. H01L 21/336
(52) U.S. Cl. ........................... 438/296; 438/424; 438/445
(58) Field of Search .................................... 438/296, 424, 438/445

(56) References Cited

U.S. PATENT DOCUMENTS

| | | | |
|---|---|---|---|
| 4,495,025 | 1/1985 | Haskell | 156/648 |
| 4,707,218 | 11/1987 | Giammarco et al. | 156/643 |
| 4,857,477 | 8/1989 | Kanamori | 437/47 |
| 5,674,775 | 10/1997 | Ho et al. | 437/67 |
| 5,719,085 | * 2/1998 | Moon et al. . | |
| 5,801,083 | * 9/1998 | Yu et al. . | |
| 5,866,435 | 2/1999 | Park | 437/65 |
| 6,020,230 | * 2/2000 | Wu . | |
| 6,074,932 | * 6/2000 | Wu . | |
| 6,080,628 | * 6/2000 | Cherng . | |

\* cited by examiner

Primary Examiner—Jey Tsai
Assistant Examiner—Josetta Jones
(74) Attorney, Agent, or Firm—George O. Saile; Rosemary L. S. Pike; Doug R. Schnabel

(57) ABSTRACT

A method of fabricating shallow trench isolations has been achieved. A semiconductor substrate is provided. A pad oxide layer is grown overlying the semiconductor substrate. A silicon nitride layer is deposited. The silicon nitride layer and the pad oxide layer are patterned to form a hard mask. The openings in the hard mask correspond to planned trenches in the semiconductor substrate. A silicon dioxide layer is deposited overlying the silicon nitride layer and the semiconductor substrate. The silicon dioxide layer is anisotropically etched to form sidewall spacers on the inside of the openings of the hard mask. The semiconductor substrate is etched to form the trenches. The sidewall spacers are etched away. The semiconductor substrate is sputter etched to round the corners of the trenches. An oxide trench lining layer is grown overlying the semiconductor substrate. A trench fill layer is deposited overlying the silicon nitride layer and filling the trenches. The trench fill layer is polished down to the top surface of the silicon nitride layer. The silicon nitride layer is etched away. The trench fill layer and the pad oxide layer are polished down to the top surface of the semiconductor substrate to complete the shallow trench isolation, and the integrated circuit device is completed.

18 Claims, 6 Drawing Sheets

1

METHOD TO FORM SHALLOW TRENCH ISOLATIONS WITH ROUNDED CORNERS AND REDUCED TRENCH OXIDE RECESS

BACKGROUND OF THE INVENTION (1) Field of the Invention

The invention relates to a method of fabricating semiconductor structures, and more particularly, to the fabrication of shallow trench isolations in the manufacture of integrated circuit devices.

(2) Description of the Prior Art

Shallow trench isolations (STI) are a method used to provide insulated isolations between active device areas in the semiconductor substrate. The use of STI has increased in recent years in the art of integrated circuit manufacturing. Formerly, local oxidation of silicon (LOCOS) was the dominant technique used to provide substrate isolation. STI has a much flatter topology than LOCOS. In addition, STI structures do not create perimeter bird's beak structures that can cause reliability and electrical performance problems.

Referring to FIG. 1, a cross-section of a partially completed prior art shallow trench isolation is shown. A semiconductor substrate 10 of silicon is shown. A pad oxide layer 14 is grown overlying the semiconductor substrate 10. A silicon nitride layer 18 is deposited overlying the pad oxide layer 14. The silicon nitride layer 18 and the pad oxide layer 14 are patterned to form a hard mask. The openings in the hard mask are created to expose the semiconductor substrate 10 where the trenches are planned.

Referring to FIG. 2, trenches are etched into the semiconductor substrate 10.

Referring to FIG. 3, an oxide trench liner layer 20 is grown overlying the semiconductor substrate 10. This oxide trench liner layer 20 serves several purposes. First, it reduces stress in the semiconductor substrate 10 induced by the etch. Second, it provides some minimal rounding of the trench corners. Third, the oxide trench liner layer 20 provides some minimal protection against oxide recess, as will be seen in FIG. 5. After the oxide trench liner layer 20 is grown, a trench fill layer 22 is deposited overlying the silicon nitride layer 18 and filling the trenches.

Referring to FIG. 4, the trench fill layer 22 is first polished down to the top surface of the silicon nitride layer 18. Next, the silicon nitride layer 18 is etched away.

Referring now to FIG. 5, the trench fill layer 22 is again polished down. Once the trench fill layer 22 and pad oxide layer 14 are polished down to the surface of the semiconductor substrate 10, the shallow trench isolation device is completed.

We note two potential problems with the prior art shallow trench isolation structure completed in FIG. 5. First, the relatively sharp corners 30 of the STI structure can cause electrical parametric problems in MOS devices fabricated adjacent to the structure. For example, a subthreshold "$V_t$-kink" can be seen in MOS transistors adjacent to a STI that has relatively sharp corners. Second, the final polish down of the trench fill layer 22 can cause a recession of the oxide 34 at the corners of the STI. This problem results in high junction leakage, especially if the device formed is salicided.

Several prior art approaches disclose methods to form trenches in the substrate in the fabrication of integrated circuits. U.S. Pat. No. 5,801,083 to Yu et al discloses a process to form shallow trench isolation with rounded corners. Polymer spacers are formed to cause a widening of the silicon nitride mask above the shallow trenches. After the polymer spacers are removed, a thermal oxide is grown to line the trenches. This approach has the disadvantages of possible carbon contamination due to the polymer and the difficulty of controlling the thickness of the polymer sidewalls. U.S. Pat. No. 5,866,435 to Park teaches a method to form shallow trenches where a first mask is formed exposing the substrate where trenches are planned. A second masking layer, of polysilicon or amorphous silicon, is deposited overlying the first mask and the exposed substrate. The second masking layer is etched anisotropically down. When exposed, the substrate is simultaneously etched down with the second masking layer. When the second mask layer is etched away, the shallow trench is completed. U.S. Pat. No. 4,857,477 to Kanamori discloses a process to fabricate a trench for a trench capacitor. An oxide mask overlying the substrate is etched to form openings for trenches. A second oxide layer is deposited and formed into oxide spacers on the sidewalls of the openings. The trenches are etched down into the substrate. The spacers are removed. The trenches are dry etched to round the edges. An insulator film is formed lining the trenches. Finally, conductive electrodes are formed inside the trenches. U.S. Pat. No. 4,707,218 to Giammarco et al teaches a process to make mask openings smaller than practical by photolithography. A photoresist layer is patterned. Sidewall spacers are formed to reduce the dimensions of the mask openings. U.S. Pat. No. 5,674,775 to Ho et al discloses a process to form trenches with rounded corners. Silicon nitride overlying pad oxide is patterned to form openings for the trenches. A polysilicon, or amorphous silicon layer, is deposited. The polysilicon layer is etched down anisotropically. The trench is etched into the substrate simultaneously with the polysilicon layer. U.S. Pat. No. 4,495,025 to Haskell teaches a process that uses sidewall spacers to create trenches of different depths in a silicon substrate.

SUMMARY OF THE INVENTION

A principal object of the present invention is to provide an effective and very manufacturable method of fabricating shallow trench isolations in the manufacture of integrated circuits.

A further object of the present invention is to provide a method to fabricate shallow trench isolations with reduced oxide recession at the edges of the structures through use of sidewall spacers on the trench mask.

Another further object of the present invention is to provide a method to fabricate shallow trench isolations with rounded trench corners through use of sidewall spacers on the trench mask and sputter etching the shallow trench.

Another further object of the present invention is to provide a method to fabricate shallow trench isolations with rounded trench corners through use of sidewall spacers on the trench mask and hydrogen annealing the shallow trench.

In accordance with the objects of this invention, a new method of fabricating shallow trench isolations has been achieved. A semiconductor substrate is provided. A pad oxide layer is grown overlying the semiconductor substrate. A silicon nitride layer is deposited overlying the pad oxide layer. The silicon nitride layer and the pad oxide layer are patterned to form a hard mask. The openings in the hard mask correspond to planned trenches in the semiconductor substrate. A silicon dioxide layer is deposited overlying the silicon nitride layer and the semiconductor substrate. The silicon dioxide layer is anisotropically etched to form sidewall spacers on the inside of the openings of the hard mask. The semiconductor substrate is etched to form the trenches.

The sidewall spacers are etched away. The semiconductor substrate is sputter etched to round the corners of the trenches. An oxide trench lining layer is grown overlying the semiconductor substrate. A trench fill layer is deposited overlying the silicon nitride layer and the oxide trench lining layer and filling the trenches. The trench fill layer is polished down to the top surface of the silicon nitride layer. The silicon nitride layer is etched away. The trench fill layer and the pad oxide layer are polished down to the top surface of the semiconductor substrate to complete the shallow trench isolation, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

This embodiment discloses the application of the present invention to the formation of shallow trench isolations in the fabrication of an integrated circuit device. It should be clear to those skilled in the art that the present invention could be extended or applied to related areas without deviating from the unique aspects of the invention.

Figure 1:
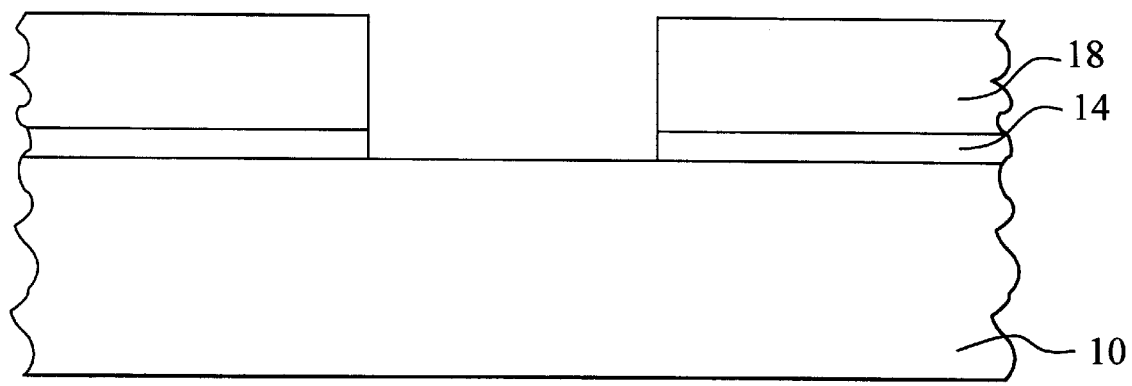
FIGS. 1 through 5 schematically illustrate in cross-section a partially completed prior art integrated circuit device. A process to fabricate shallow trench isolations is depicted.
Figure 2:
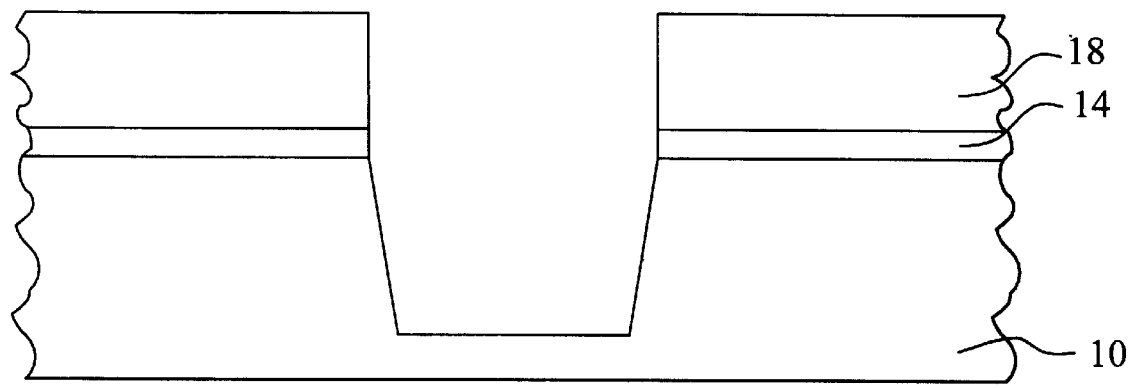
Figure 3:
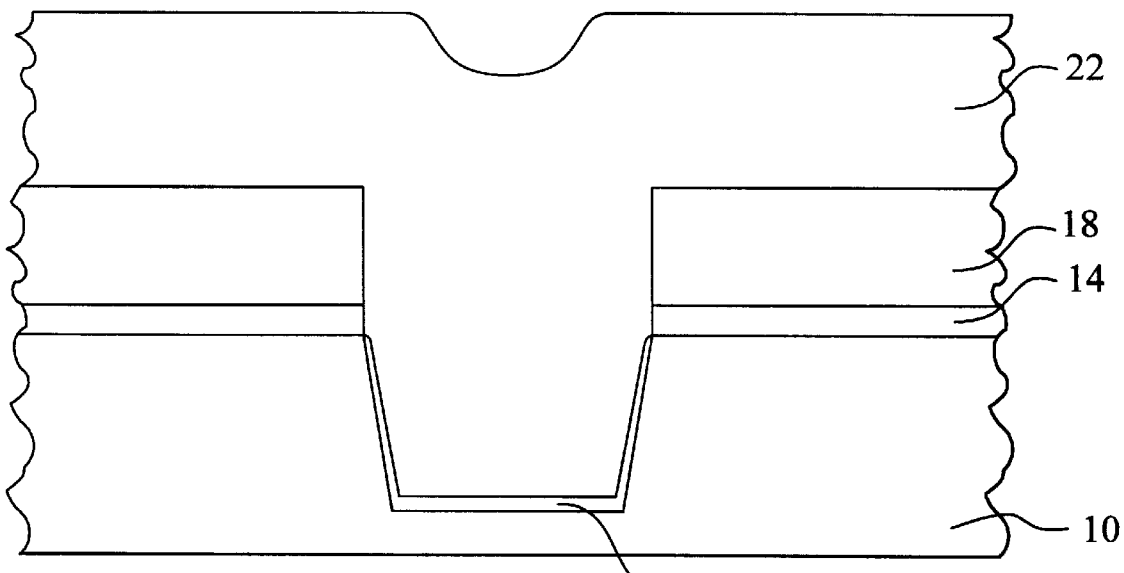
Figure 4:
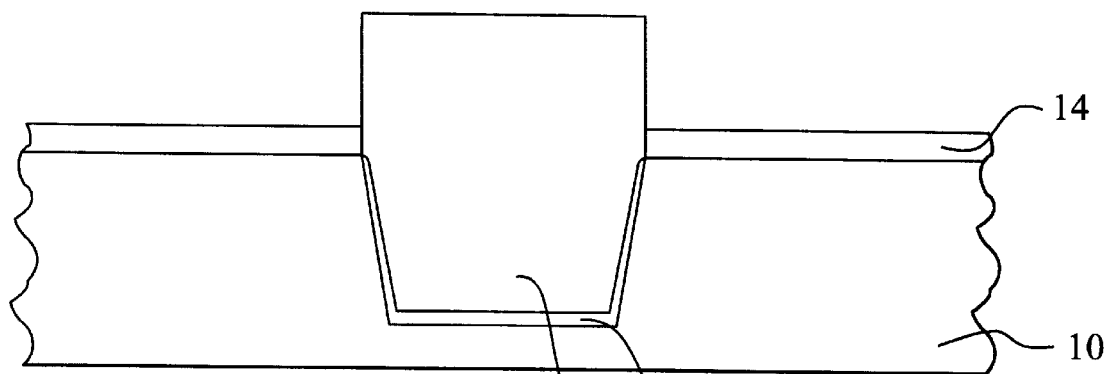
Figure 5:
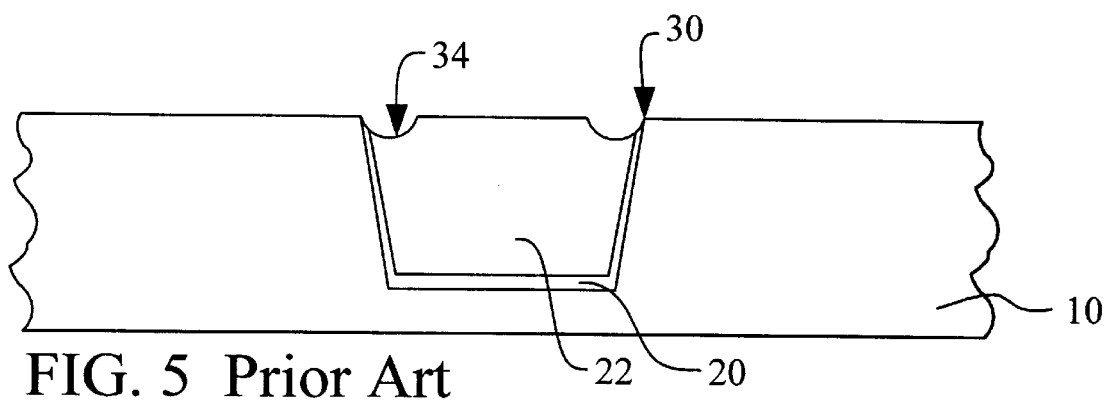
Figure 6:
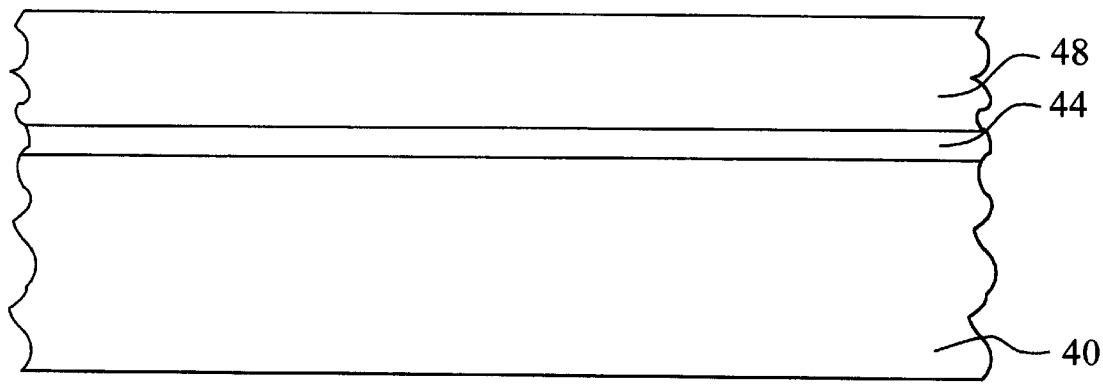
FIGS. 6 through 17 schematically illustrate in cross-sectional representation a preferred embodiment of the present invention.

Referring now particularly to FIG. 6, there is shown a cross section of a partially completed integrated circuit device of the preferred embodiment. A semiconductor substrate 40 is provided. The semiconductor substrate 40 typically comprises monocrystalline silicon. A pad oxide layer 44 is grown overlying the semiconductor substrate 40. The purpose of the pad oxide layer 44 is to provide a good adhesion layer for the silicon nitride layer 48 and to reduce surface stress in the semiconductor substrate 40. The pad oxide layer 44 is thermally grown to a thickness of between about 100 Angstroms and 300 Angstroms using a conventional process. The silicon nitride layer 48 is deposited overlying the pad oxide layer 44. The silicon nitride layer 48 will form the hard mask for the subsequent etching of the shallow trenches. The silicon nitride layer is deposited using a low pressure chemical vapor deposition (LPCVD) process to a thickness of between about 1,000 Angstroms and 3,000 Angstroms.

Figure 7:
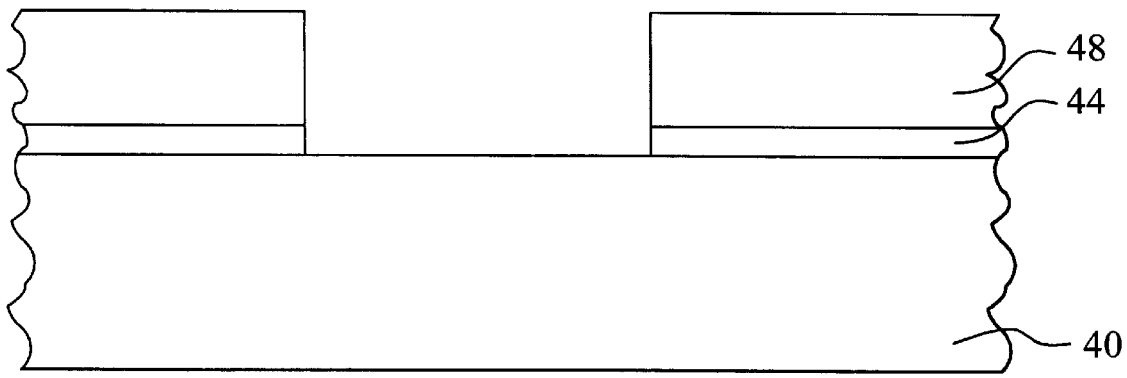

Referring now to FIG. 7, the silicon nitride layer 48 and the pad oxide layer 44 are patterned to form a hard mask. The openings in the hard mask correspond to planned trenches in the semiconductor substrate 40. The patterning is performed using a conventional photolithographic process where photoresist is coated, exposed, and developed to reveal portions of the silicon nitride layer 48 that will be etched away.

Figure 8:
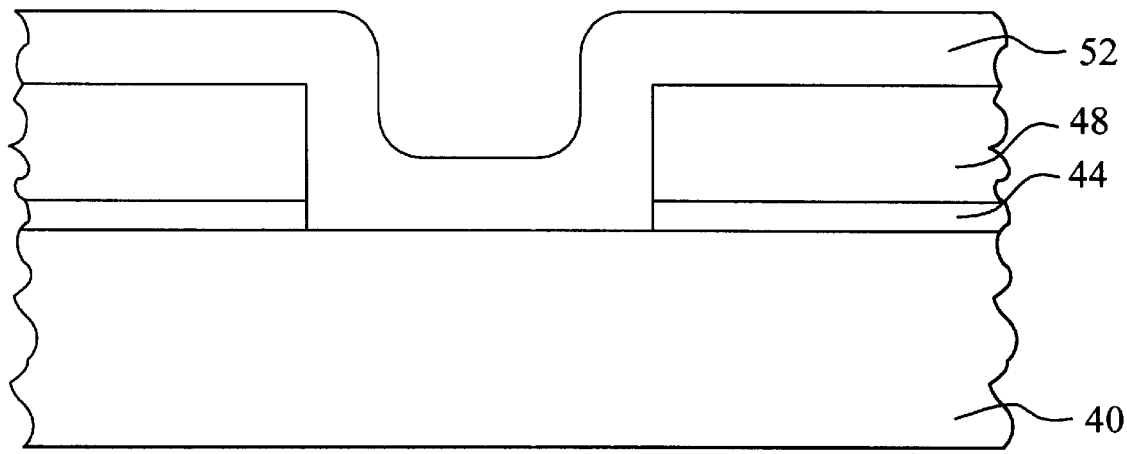

Referring now to FIG. 8, a silicon dioxide layer 52 is deposited overlying the silicon nitride layer 48 and the semiconductor substrate 40. The silicon dioxide layer 52 is conventionally deposited using a LPCVD process. The purpose of the silicon dioxide layer 52 is to create sidewall spacers in the subsequent processing step. The silicon dioxide layer 52 is deposited to a thickness of between about 500 Angstroms and 1,500 Angstroms.

Figure 9:
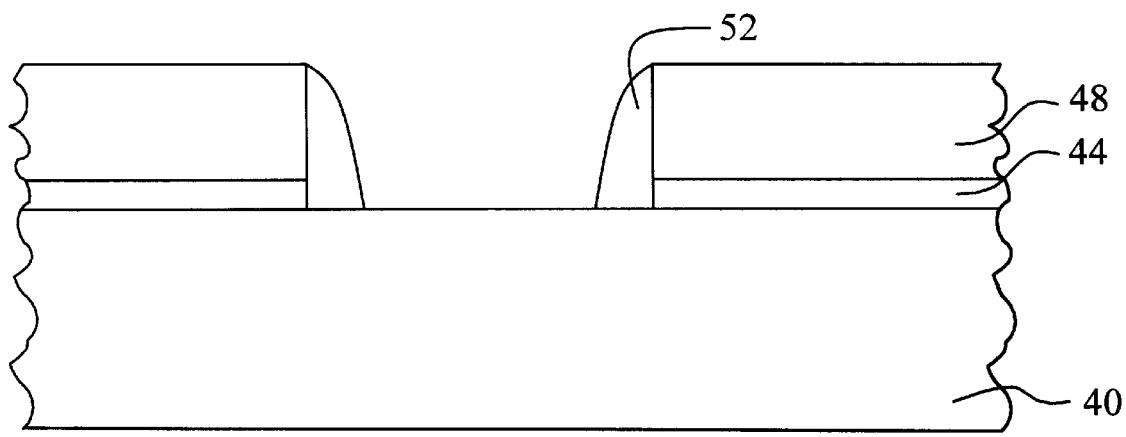

Referring now to FIG. 9, an important aspect of the present invention is shown. The silicon dioxide layer 52 is anisotropically etched to form sidewall spacers 52 on the inside of the openings of the hard mask. The etching process is preferably a dry etch using a chemistry comprising $CF_4$, $CHF_3$, and Ar.

Following the etch, the sidewall spacers 52 formed have a width of between about 300 Angstroms and 1,000 Angstroms. The sidewall spacers 52 are important to the present invention because, when they are removed at a later step, the area of the substrate that has been reserved by the sidewall spacers 52 will be used to improve the surface characteristics of the shallow trench and of the completed STI.

Figure 10:
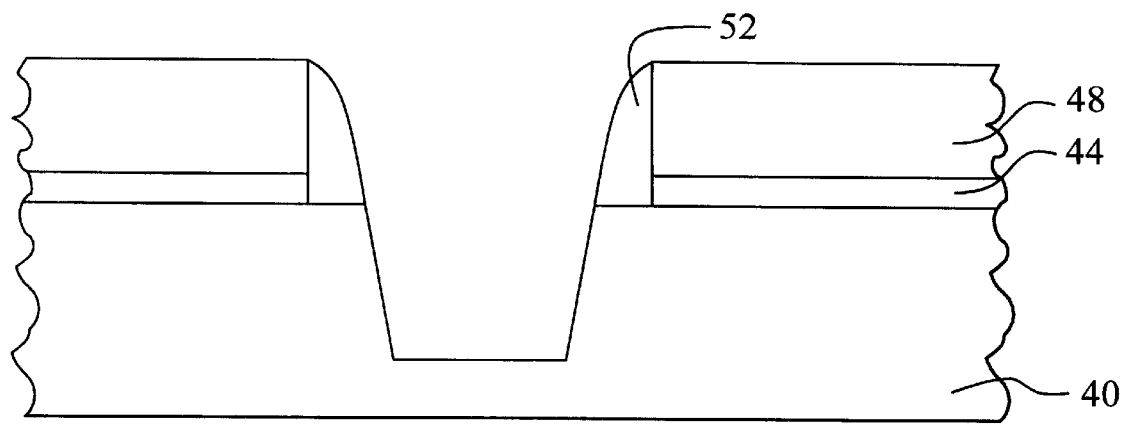

Referring now to FIG. 10, the semiconductor substrate 40 is etched to form the trenches. The hard mask, composed now of the silicon nitride layer 48 and the silicon dioxide sidewall spacers 52, focuses the etch on the exposed semiconductor substrate 40. A conventional dry etching process is used to create the trenches. The dry etching chemistry comprises Ar, $O_2$, $CF_4$, and $CHF_3$. Typically, the trenches are etched to a depth of between about 1,500 Angstroms and 3,500 Angstroms deep.

Figure 11:
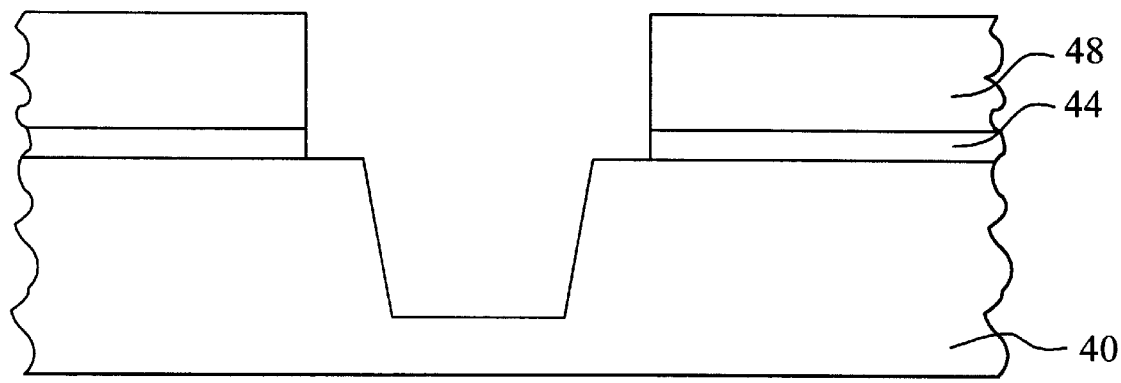

Referring now to FIG. 11, the sidewall spacers are etched away. A wet etch comprising HF may be used. Alternatively, a dry etch with $CF_4$, $CHF_3$, and Ar may be used.

Figure 12:
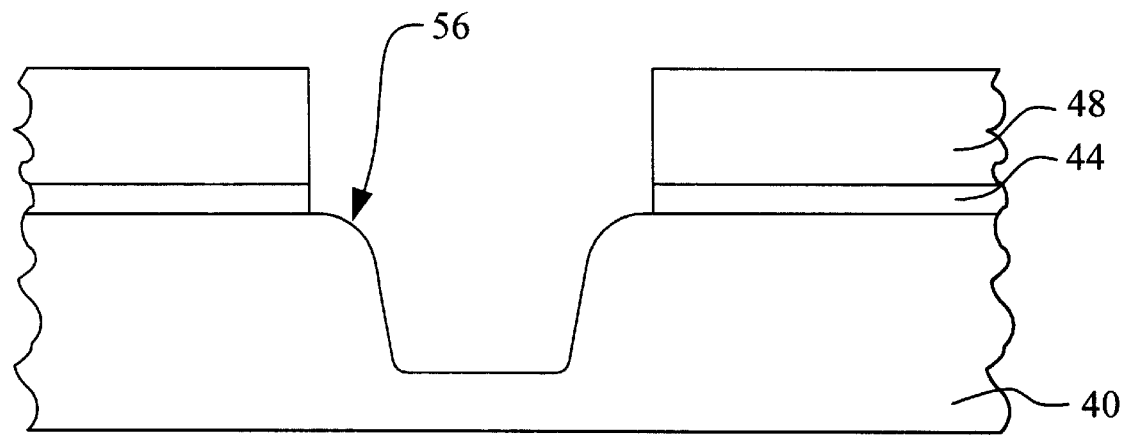

Referring now to FIG. 12, an optional but important part of the present invention is shown. The semiconductor substrate 40 is sputter etched to round the corners of the trenches 56. This step is performed to reduce the sharpness of the corners and to eliminate the MOS parametric problems experienced with the prior art example. The sputter etching step is performed using a plasma etching process with a chemistry comprising $Cl_2$, $BCl_3$, $CCl_4$, $CHF_3$, $CF_4$, and a combination of HBr, $Cl_2$, and $O_2$. Note that additional semiconductor substrate 40 surface area was exposed because of the presence of the sidewall spacers in the earlier etch. This additional area allows gently sloping top corners to be created by the sputter etch process.

The rounding of the trench corners depicted in FIG. 12 can also be accomplished through use of a hydrogen anneal. In a hydrogen anneal step, etch induced stresses in the semiconductor substrate 40 are relieved. Sharp edges are softened by densification. The hydrogen anneal used here comprises: an $H_2$ ambient with a temperature of between about 800 degrees C. and 1,200 degrees C. for between about 15 minutes and 60 minutes. High temperature annealing allows microstructure transformation that minimizes surface energy by forming a rounded corner.

Figure 13:
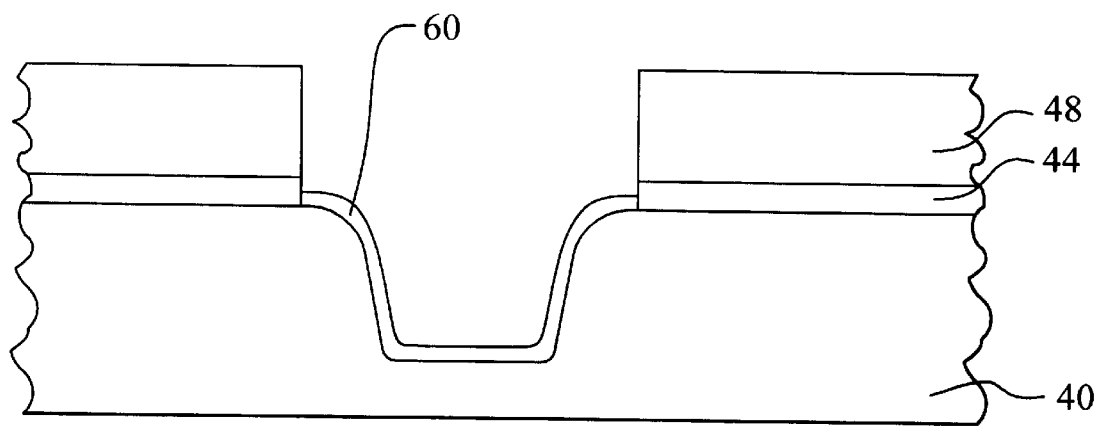

Referring now to FIG. 13, an oxide trench lining layer 60 is grown overlying the semiconductor substrate 40. The purpose of the oxide trench lining layer 60 is to enhance the protection of the shallow trench isolation against oxide recess. In addition, the oxide trench lining layer 60 relieves etch induced stress in the semiconductor substrate 40. The oxide trench lining layer 60 is thermally grown using a conventional process to a thickness of between about 100 Angstroms and 300 Angstroms. Note that the use of the sidewall spacers in the early etching step has allowed the oxide trench lining layer 60 to grow vertically at the very top corners of the trench. This is important, because this oxide trench lining layer 60 will be present at the end of the STI process to provide a buffer layer to reduce the effect of any over polishing that might occur.

Figure 14:
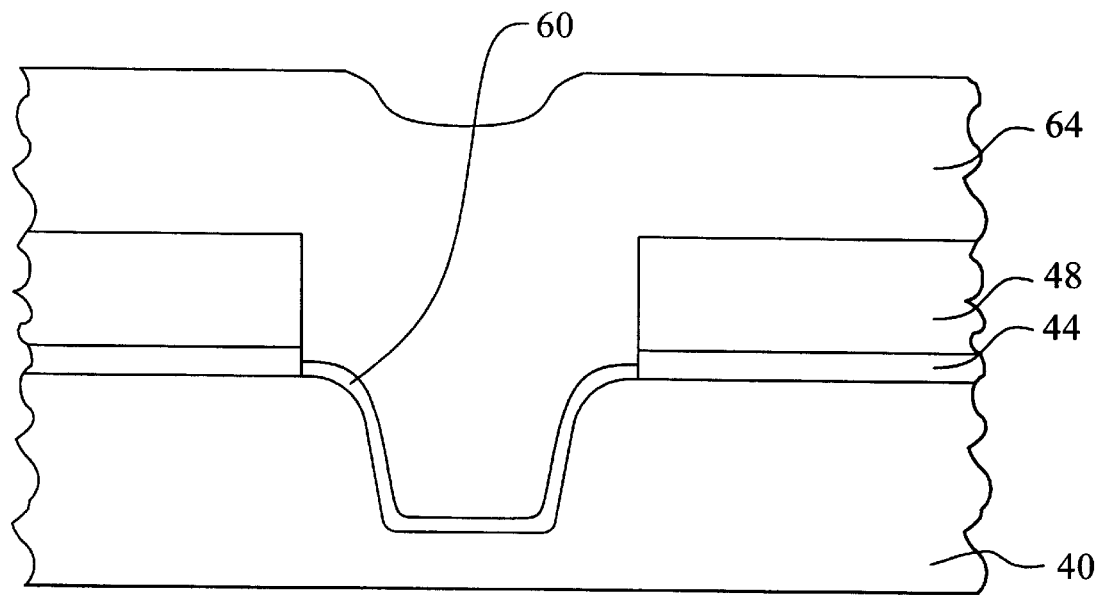

Referring now to FIG. 14, a trench fill layer 64 is deposited overlying the silicon nitride layer 48 and the oxide trench lining layer 60 and filling the trenches. The trench fill layer 64 is preferably composed of silicon dioxide that is deposited using a LPCVD or high density plasma (HDP)

process. The purpose of the trench fill layer 64 is to provide an insulating fill for the shallow trench isolation. The trench fill layer 64 is deposited to a thickness of between about 5,000 Angstroms and 9,000 Angstroms.

Figure 15:
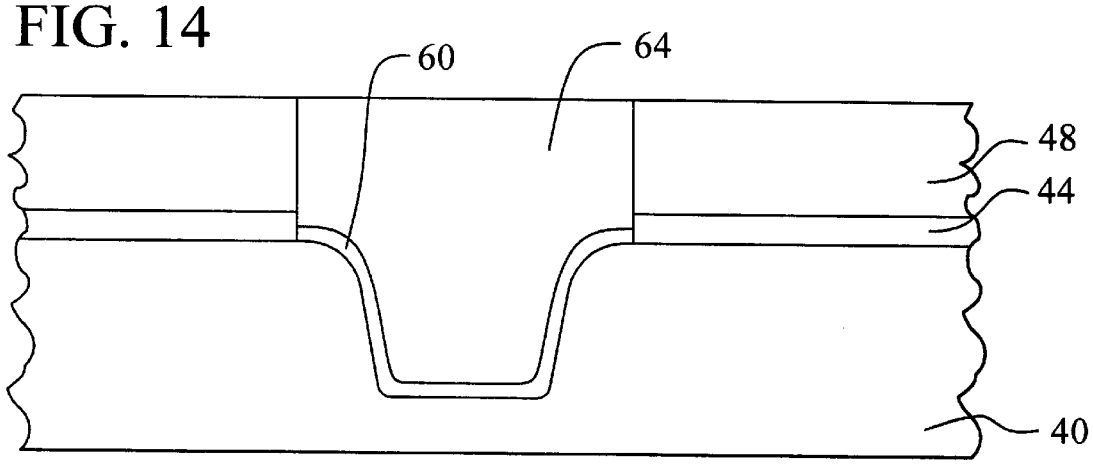

Referring now to FIG. 15, the trench fill layer 64 is polished down to the top surface of the silicon nitride layer 48. The polishing down step is performed using a conventional chemical mechanical polish (CMP).

Figure 16:
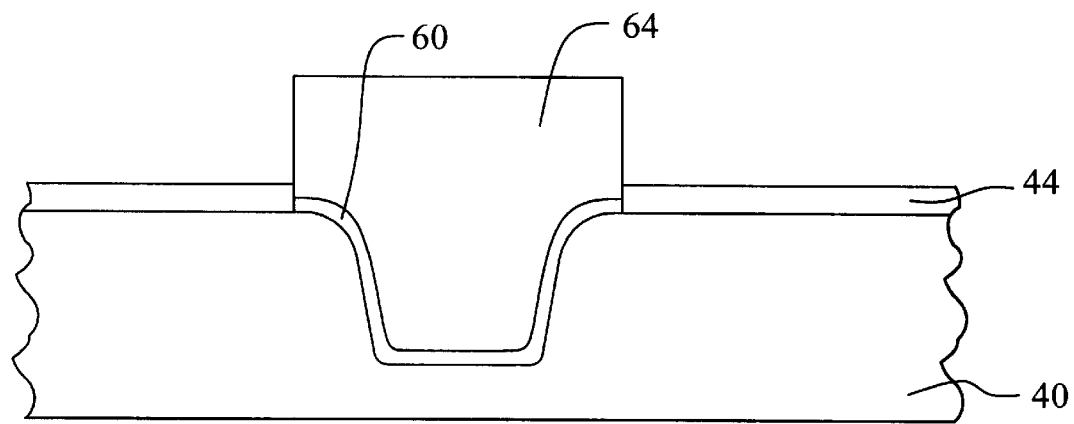

Referring now to FIG. 16, the silicon nitride layer 48 is etched away. A typical hot phosphoric acid ($H_3PO_4$) wet etch is used to remove the silicon nitride layer 48 without etching the silicon dioxide layers on the wafer. Following the removal of the silicon nitride layer 48, a plug of the trench fill layer 64 extends above the surface of the wafer.

Figure 17:
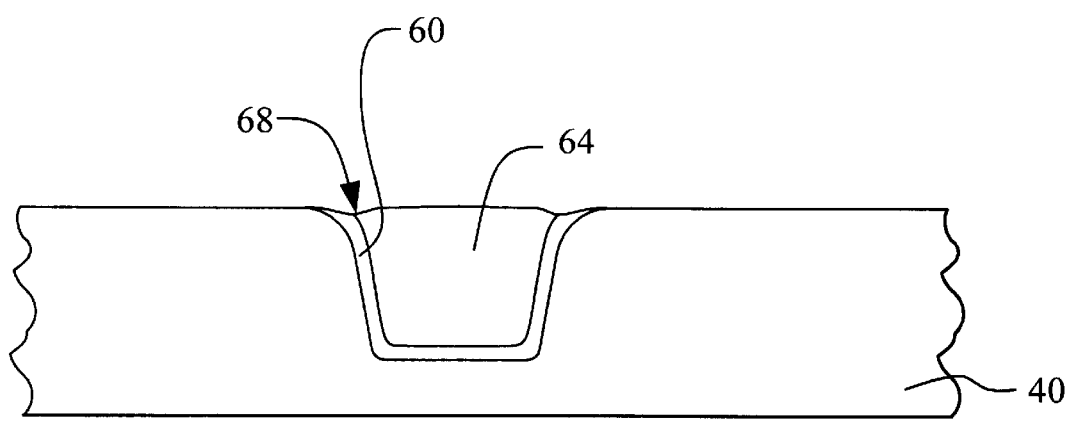

Referring now to FIG. 17, the trench fill layer 64 and the pad oxide layer 44 are polished down to the top surface of the semiconductor substrate to complete the shallow trench isolation. A conventional CMP process is used to remove the excess oxides. As shown in the illustration, a slight amount of over polishing 68 may occur. This does not cause a problem because of the presence of the oxide trench lining layer 60 overlying the top edges of the trenches. Again, the reason the oxide trench lining layer 60 is present at these locations is due to the offsets created by the sidewall spacers. The problem of oxide recession is therefore eliminated.

As shown in the preferred embodiment, the present invention provides a very manufacturable process for fabricating shallow trench isolations in the manufacture of integrated circuit devices. Problems caused by sharp trench corners are eliminated by corner rounding techniques. Other problems caused by oxide recession due to over polishing are also eliminated through use of sidewall spacers in the etching step.

While the invention has been particularly shown and described with reference to the preferred embodiments thereof, it will be understood by those skilled in the art that various changes in form and details may be made without departing from the spirit and scope of the invention.

What is claimed is:

1. A method for fabricating shallow trench isolations in the manufacture of an integrated circuit device comprising:
   providing a semiconductor substrate;
   growing a pad oxide layer overlying said semiconductor substrate;
   depositing a silicon nitride layer overlying said pad oxide layer;
   patterning said silicon nitride layer and said pad oxide layer to form a hard mask wherein openings in said hard mask correspond to planned trenches;
   depositing a silicon dioxide layer overlying said silicon nitride layer and said semiconductor substrate; anisotropically etching said silicon dioxide layer to form sidewall spacers on the inside of said openings in said hard mask;
   thereafter etching said semiconductor substrate to form said trenches;
   thereafter etching away said sidewall spacers;
   thereafter rounding corners of said trenches by sputter etching said semiconductor substrate or by annealing said semiconductor substrate with hydrogen;
   thereafter growing an oxide trench lining layer overlying said semiconductor substrate;
   depositing a trench fill layer overlying said silicon nitride layer and said oxide trench lining layer and filling said trenches;
   polishing down said trench fill layer to the top surface of said silicon nitride layer;
   etching away said silicon nitride layer;
   polishing down said trench fill layer and said pad oxide layer to the top surface of said semiconductor substrate to complete said shallow trench isolations; and
   completing said integrated circuit device.

2. The method according to claim 1 wherein said silicon nitride layer is deposited to a thickness of between about 1,000 Angstroms and 2,000 Angstroms.

3. The method according to claim 1 wherein said silicon dioxide layer is deposited to a thickness of between about 500 Angstroms and 1,500 Angstroms.

4. The method according to claim 1 wherein said sidewall spacers are formed to a width of between about 300 microns and 1,000 microns.

5. The method according to claim 1 wherein said trench fill layer comprises silicon dioxide deposited to a thickness of between about 5,000 Angstroms and 9,000 Angstroms.

6. The method according to claim 1 wherein said oxide trench lining layer is deposited to a thickness of between about 100 Angstroms and 300 Angstroms.

7. A method for fabricating shallow trench isolations in the manufacture of an integrated circuit device comprising:
   providing a semiconductor substrate;
   growing a pad oxide layer overlying said semiconductor substrate;
   depositing a silicon nitride layer overlying said pad oxide layer;
   patterning said silicon nitride layer and said pad oxide layer to form a hard mask wherein openings in said hard mask correspond to planned trenches;
   depositing a silicon dioxide layer overlying said silicon nitride layer and said semiconductor substrate;
   anisotropically etching said silicon dioxide layer to form sidewall spacers on the inside of said openings in said hard mask;
   thereafter etching said semiconductor substrate to form said trenches;
   thereafter etching away said sidewall spacers;
   thereafter sputter etching said semiconductor substrate to thereby round the corners of said trenches;
   thereafter growing an oxide trench lining layer overlying said semiconductor substrate;
   depositing a trench fill layer overlying said silicon nitride layer and said oxide trench lining layer and filling said trenches;
   polishing down said trench fill layer to the top surface of said silicon nitride layer;
   etching away said silicon nitride layer;
   polishing down said trench fill layer and said pad oxide layer to the top surface of said semiconductor substrate to complete said shallow trench isolations; and
   completing said integrated circuit device.

8. The method according to claim 7 wherein said silicon dioxide layer is deposited to a thickness of between about 500 Angstroms and 1,500 Angstroms.

9. The method according to claim 7 wherein said sidewall spacers are formed to a width of between about 300 microns and 1,000 microns.

10. The method according to claim 7 wherein said trench fill layer comprises silicon dioxide deposited to a thickness of between about 5,000 Angstroms and 9,000 Angstroms.

11. The method according to claim 7 wherein said oxide trench lining layer is deposited to a thickness of between about 100 Angstroms and 300 Angstroms.

12. The method according to claim 7 wherein said step of sputter etching said semiconductor substrate is by a plasma etching process with a chemistry comprising $Cl_2$, $BCl_3$, $CCl_4$, $CHF_3$, $CF_4$, and a combination of HBr, $Cl_2$, and $O_2$.

13. A method for fabricating shallow trench isolations in the manufacture of an integrated circuit device comprising:

providing a semiconductor substrate;

growing a pad oxide layer overlying said semiconductor substrate;

depositing a silicon nitride layer overlying said pad oxide layer;

patterning said silicon nitride layer and said pad oxide layer to form a hard mask wherein openings in said hard mask correspond to planned trenches;

depositing a silicon dioxide layer overlying said silicon nitride layer and said semiconductor substrate;

anisotropically etching said silicon dioxide layer to form sidewall spacers on the inside of said openings in said hard mask;

thereafter etching said semiconductor substrate to form said trenches;

thereafter etching away said sidewall spacers;

thereafter annealing said semiconductor substrate with hydrogen to thereby round the corners of said trenches;

thereafter growing an oxide trench lining layer overlying said semiconductor substrate;

depositing a trench fill layer overlying said silicon nitride layer and said oxide trench lining layer and filling said trenches;

polishing down said trench fill layer to the top surface of said silicon nitride layer;

etching away said silicon nitride layer;

polishing down said trench fill layer and said pad oxide layer to the top surface of said semiconductor substrate to complete said shallow trench isolations; and completing said integrated circuit device.

14. The method according to claim 13 wherein said silicon dioxide layer is deposited to a thickness of between about 500 Angstroms and 1,500 Angstroms.

15. The method according to claim 13 wherein said sidewall spacers are formed to a width of between about 300 microns and 1,000 microns.

16. The method according to claim 13 wherein said trench fill layer comprises silicon dioxide deposited to a thickness of between about 5,000 Angstroms and 9,000 Angstroms.

17. The method according to claim 13 wherein said oxide trench lining layer is deposited to a thickness of between about 100 Angstroms and 300 Angstroms.

18. The method according to claim 13 wherein said step of annealing said semiconductor substrate with hydrogen to thereby round the corners of said trenches comprises: an $H_2$ ambient with a temperature of between about 800 degrees C. and 1,200 degrees C. for between about 15 minutes and 60 minutes.

* * * * *